United States Patent
Lin et al.

(10) Patent No.: US 7,312,020 B2
(45) Date of Patent: Dec. 25, 2007

(54) LITHOGRAPHY METHOD

(75) Inventors: Chin-Lung Lin, Hsin-Chu Hsien (TW); Chuen Huei Yang, Taipei (TW); Ming-Jui Chen, Hsin-Chu (TW); Venson Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 396 days.

(21) Appl. No.: 10/605,968

(22) Filed: Nov. 10, 2003

(65) Prior Publication Data

US 2005/0100829 A1    May 12, 2005

(51) Int. Cl.
*G03F 1/00* (2006.01)
(52) U.S. Cl. ............... 430/322; 430/5; 430/396
(58) Field of Classification Search ............ None
See application file for complete search history.

(56) References Cited

U.S. PATENT DOCUMENTS 6,388,736 B1 * 5/2002 Smith et al. ............ 355/53
2004/0013948 A1 * 1/2004 Lin et al. ............... 430/5
2004/0229131 A1 * 11/2004 Lin et al. .............. 430/5

* cited by examiner

*Primary Examiner*—John A. McPherson
*Assistant Examiner*—Daborah Chacko-Davis
(74) *Attorney, Agent, or Firm*—Winston Hsu

(57) ABSTRACT

A lithography method for forming a plurality of patterns in a photoresist layer. A phase shift mask including a plurality of transparent main features, a plurality of first phase shift transparent regions, and a plurality of second phase shift transparent regions is provided. Each transparent main feature is surrounded by the first phase shift transparent regions and the second phase shift transparent regions interlaced contiguously along a periphery of the transparent main feature. Each of the first phase shift transparent regions has a phase shift relative to each of the second phase shift transparent regions. An exposure process is performed to irradiate the phase shift mask with light so that the patterns corresponding to the transparent main features are formed in the photoresist layer.

20 Claims, 6 Drawing Sheets

LITHOGRAPHY METHOD

BACKGROUND OF INVENTION

1. Field of the Invention

The present invention relates to a lithography method, and more particularly, to a lithography method utilizing a selective chromeless phase shift mask (PSM) to form patterns having a superior resolution and contrast in a photoresist layer.

2. Description of the Prior Art

In integrated circuit manufacturing processes, a lithographic process has become a mandatory technique. In a lithographic process, a designed pattern, such as a circuit pattern, a doping pattern, a contact hole pattern, or a trench pattern, is created on one or several photo masks, then the pattern on the photo mask is transferred by light exposure, with a stepper and scanner, into a photoresist layer on a semiconductor wafer. Only by using a lithographic process can a wafer producer precisely and clearly transfer a complicated circuit pattern onto a semiconductor wafer.

It is an important issue for solving resolution of the lithographic process due to the reducing device sizes of the semiconductor industry. Theoretically, using short wavelengths of light to expose a photoresist layer will improve the resolution right away. Short wavelengths of light are desirable as the shorter the wavelength, the higher the possible resolution of the pattern. This method, though it seems simple, is not feasible. First, light sources for providing short wavelengths of light are not accessible. Secondly, the damage of equipment is very considerable when short wavelengths of light is used to expose a photoresist layer, leading to a shortened equipment lifetime. The cost is thus raised, which makes products not competitive. Due to the conflicts between theory and practice used in manufacturing, the manufacturers are all devoted to various researches so as to overcome this problem.

Please refer to FIG. 1, FIG. 1 is a schematic diagram illustrating a prior art method for improving a resolution of contact hole patterns 24 by utilizing an attenuated phase shift mask. As shown in FIG. 1, the attenuated phase shift mask 10 is formed from a quartz substrate. A plurality of contact hole features 12 and a not completely transparent region 14 enclosing each of the contact hole features 12 are included on attenuated phase shift mask 10. Actually, the not completely transparent region 14 of the attenuated phase shift mask 10 is coated with a single-layered embedded layer 16. The embedded layer 16 is not only an absorption layer, but also is a phase shift layer. Since the transmittance and the phase shift angle required by the process can be achieved by utilizing the single-layered embedded layer 16, the embedded layer 16 is also called an absorptive shifter. In addition, the attenuated phase shift mask is also called a half-tone mask.

When a specific wavelength of light (correlating to the embedded layer) is utilized to perform the exposure process, light will pass through each of the contact hole features 12 successfully to reach a photoresist layer 22 on a wafer 18. Because the embedded layer 16 has a specific transmittance (usually between 2-15%), portions of the light passing through the embedded layer 16 will have a phase shift of 180 degrees relative to the original light, and will result in destructive interference with the light passing through the contact hole features 12. After develop and bake processes are performed, the contact hole patterns 24 defined by the residual photoresist layer and corresponding to the contact hole features 12 will be formed in the photoresist layer 22. Thanks to the interference effect caused by light passing through the embedded layer 16, the resolution of the contact hole patterns 24 is improved.

Please refer to FIG. 2, FIG. 2 is a schematic diagram illustrating a stepper 30 utilizing an on-axis illumination method. As shown in FIG. 2, light beams originating from a light source 32 pass through condenser lens 34 first, then evenly illuminate a mask 36 having contact hole patterns (not shown) on it. Diffraction effects occur because the mask 36 hinders incident light. The even incident light is thus separated into diffraction light of different orders. The diffraction light of different orders is thereafter incident upon projection lens 38 to allow the projection lens 38 to collect the diffraction light of different orders and to focus them on a wafer 42. However, the smaller the critical dimension (CD) is, the larger the diffraction angle of the incident light is with the same exposure light source, theoretically. When the critical dimension of the contact hole patterns (not shown) is very small, the diffraction angle of the incident light becomes very large. Under the circumstances, the projection lens 38 can only collect the zero order (0 order) light from perpendicularly incident light beams due to the large diffraction angles, leading to images having poor resolution on the wafer 42, or even leading to unexposed images on the wafer 42.

In order to resolve this problem, an attenuated phase shift mask is usually used in conjunction with a stepper utilizing an off-axis illumination (OAI) method. Please refer to FIG. 3, FIG. 3 is a schematic diagram illustrating a stepper 50 utilizing an off-axis illumination (OAI) method. As shown in FIG. 3, the light beams illuminate a mask 54 having contact hole patterns (not shown) on it with a specific incident angle when they are transmitted through the off-axis aperture 52. The mask 54 will then diffract the light beams passing through it and allow zero and first order diffracted light interfere on a surface of a wafer 56 and contribute to the image formation. However, the incident angle needs to be adjusted according to the pattern spatial frequencies, and the exposure time needs to be increased in order to compensate for the loss of illumination due to tilting. In summary, the illumination is tilted symmetrically to an angle to allow the un-diffracted light (the zero order light) and the first-order diffracted light (the +first order light) to pass through the mask 54 and interfere on wafer 56 in this technique. Since both the zero order light and the +first order light are collected by projection lens 58 and are focused on the wafer 56, images are formed on the wafer 56 successfully. As a result, the off-axis illumination method enhances the resolution and depth of focus (DOF) of the lithographic process to produce contact hole patterns (not shown) in a photoresist layer (not shown) on the wafer 56.

However, the above-mentioned method has limitations, both in critical dimension and critical dimension uniformity. In addition, when utilizing the attenuated phase shift mask to improve the resolution of the contact hole patterns or other dense patterns, the light intensity of the side-lobe is too high to produce extra patterns if the transmittance of the embedded layer is too high. If the transmittance of the embedded layer is too low, the destructive interference of light caused by the phase shift is not enough. The side-lobe phenomenon at the edge of contact hole patterns or other dense patterns cannot be eliminated, leading to the unsatisfied pattern edge resolution.

Furthermore, the method involving adjusting the off-axis illumination method related parameters has been adapted in order to achieve a better resolution and make a compromise between resolution and depth of focus. However, satisfied results are not obtained. At the same time, man-power and time are wasted and equipment is damaged. Therefore, it is very important to develop a lithography method to improve the resolution and contrast of the contact hole patterns and other dense patterns effectively. This method is able to be applied to small-sized patterns, and should not damage equipment when using the current equipment.

SUMMARY OF INVENTION

It is therefore an objective of the claimed invention to provide a lithography method utilizing a selective chromeless phase shift mask to improve a resolution and a contrast of contact hole patterns and other dense patterns.

According to the claimed invention, a lithography method for forming a plurality of patterns in a photoresist layer on a substrate is provided. The method includes providing a phase shift mask (PSM), a plurality of transparent main features, a plurality of first phase shift transparent regions, and a plurality of second phase shift transparent regions being included on the phase shift mask, each of the transparent main features being surrounded by the first phase shift transparent regions and the second phase shift transparent regions interlaced contiguously along a periphery of the transparent main feature, and each of the first phase shift transparent regions having a phase shift relative to each of the second phase shift transparent regions. The method also includes performing an exposure process to irradiate the phase shift mask with light so that the patterns corresponding to the transparent main features are formed in the photoresist layer.

The present invention method for improving the contrast and resolution of the contact hole patterns and other dense patterns utilizes a selective chromeless alternate phase shift mask. Therefore, the waveforms produced by light passing through the transparent main features and the contrast enhanced features cancel each other out to increase the contrast of the aerial image and to improve the resolution of the contact hole patterns and other dense patterns. At the same time, the waveforms produced by light passing through the assistant features and the contrast enhanced features cancel each other out to eliminate the light leakage problem occurring in the periphery of the contact hole patterns and other dense patterns, which frequently occurs in the prior art. In addition, the conventional exposure, develop, and bake processes are utilized without changing these processes in the present invention method. Since the present invention method is able to form the contact hole patterns and other dense patterns which have a superior resolution and contrast with facility, a light source generating short wavelengths of light does not need to be used when performing the exposure process. When the present invention method is applied to a practical production line, yield is improved, manpower is saved, equipment lifetime is elongated, cycle time is shortened, and the cost is reduced.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 1:
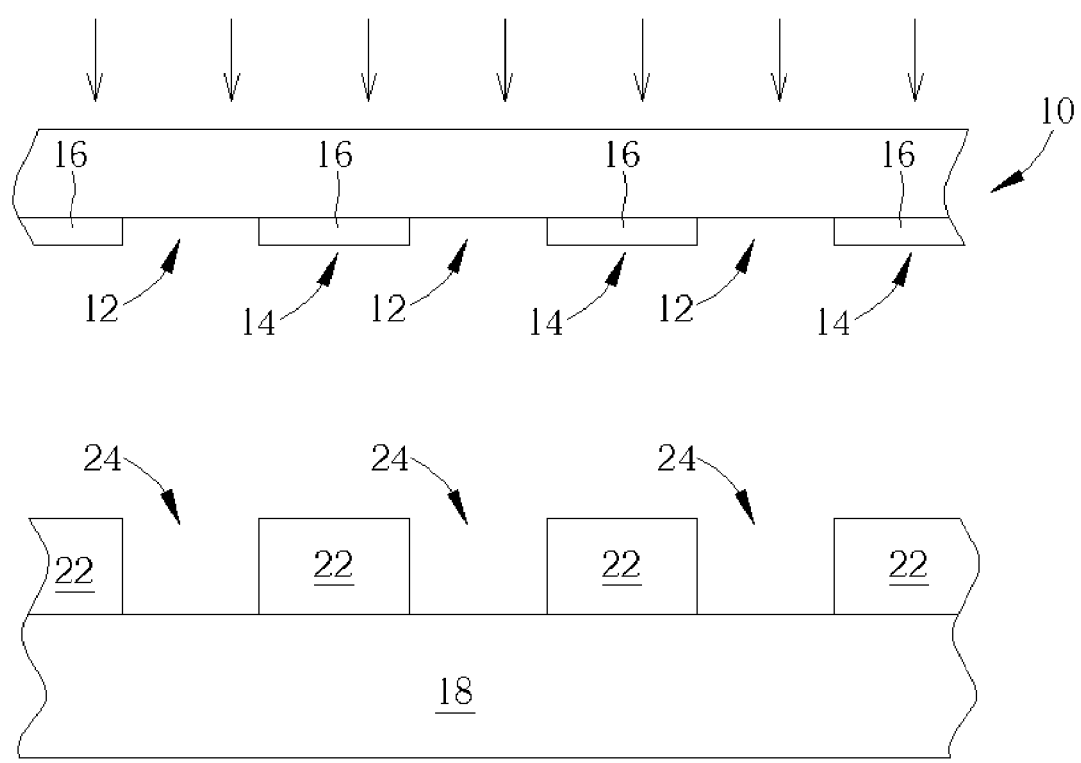
FIG. 1 is a schematic diagram illustrating a prior art method for improving a resolution of contact hole patterns by utilizing an attenuated phase shift mask.
Figure 2:
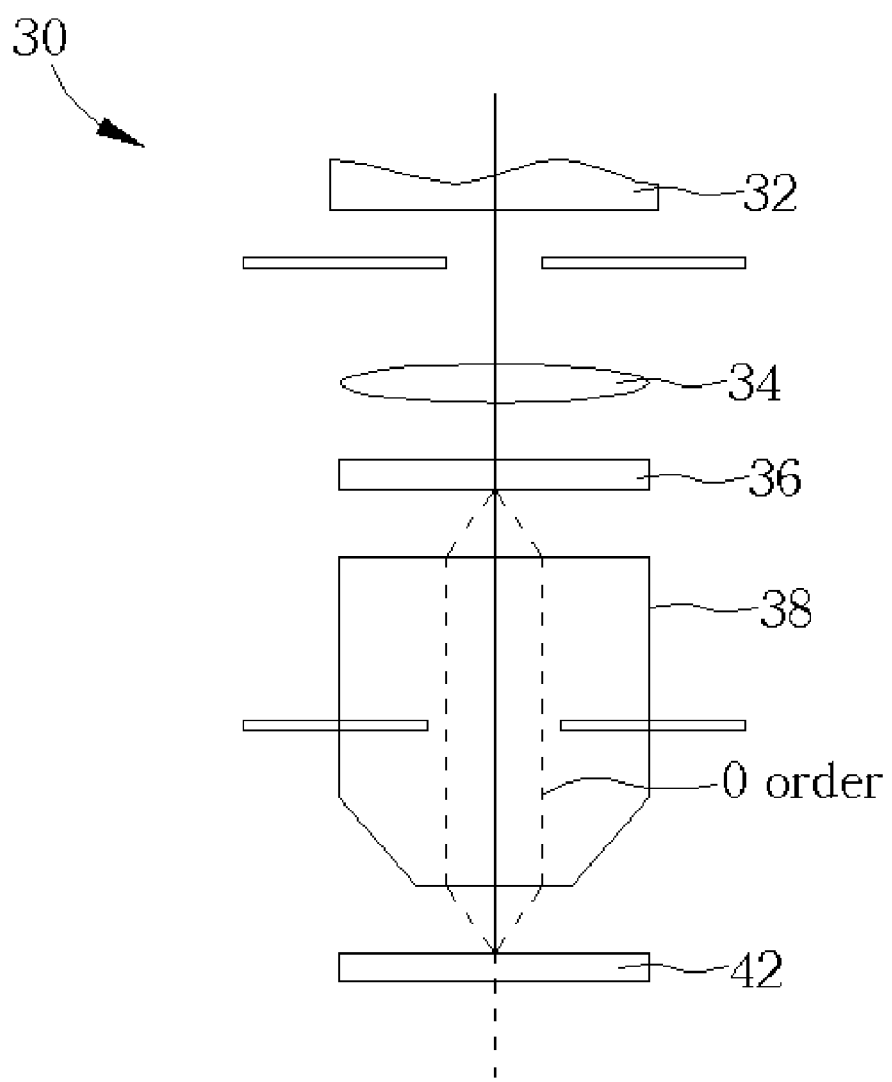
FIG. 2 is a schematic diagram illustrating a stepper utilizing an on-axis illumination method.
Figure 3:
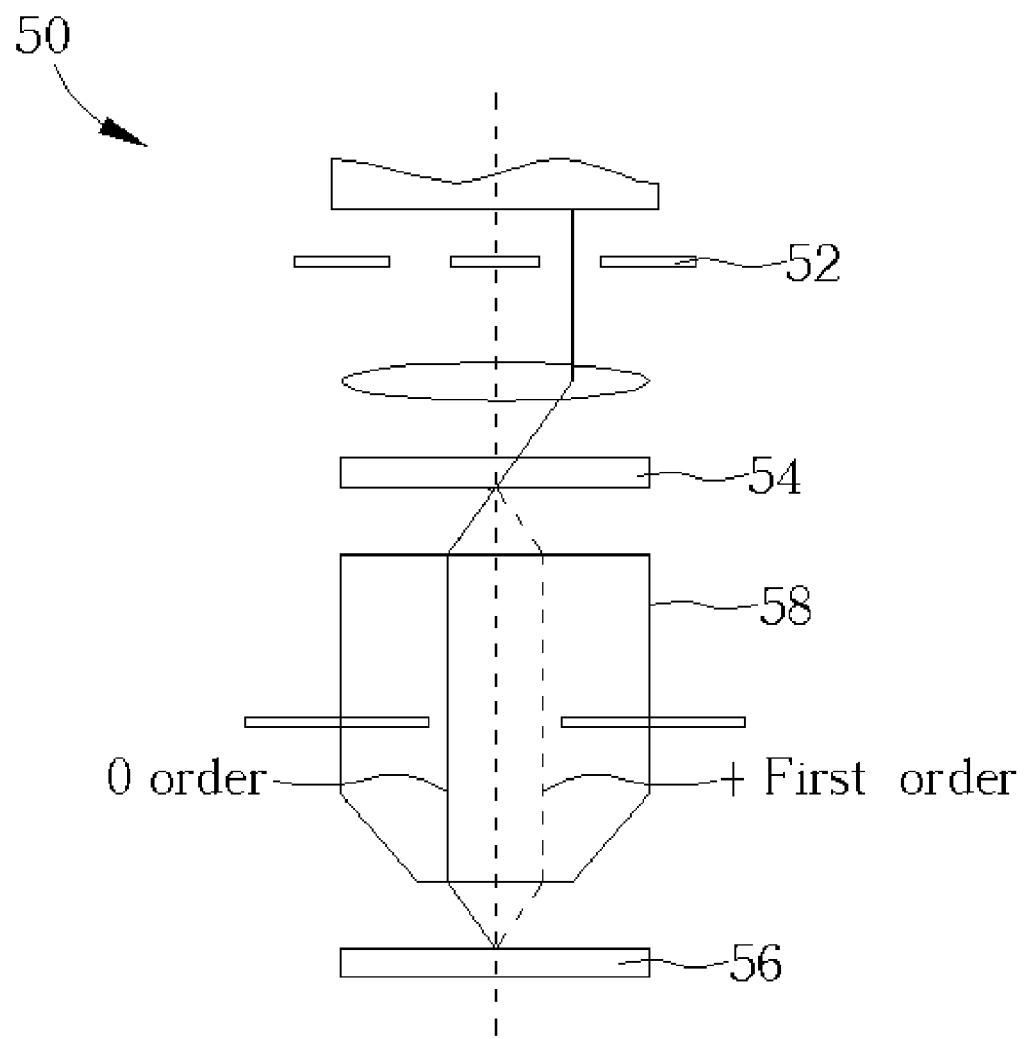
FIG. 3 is a schematic diagram illustrating a stepper utilizing an off-axis illumination (OAI) method.
Figure 4:
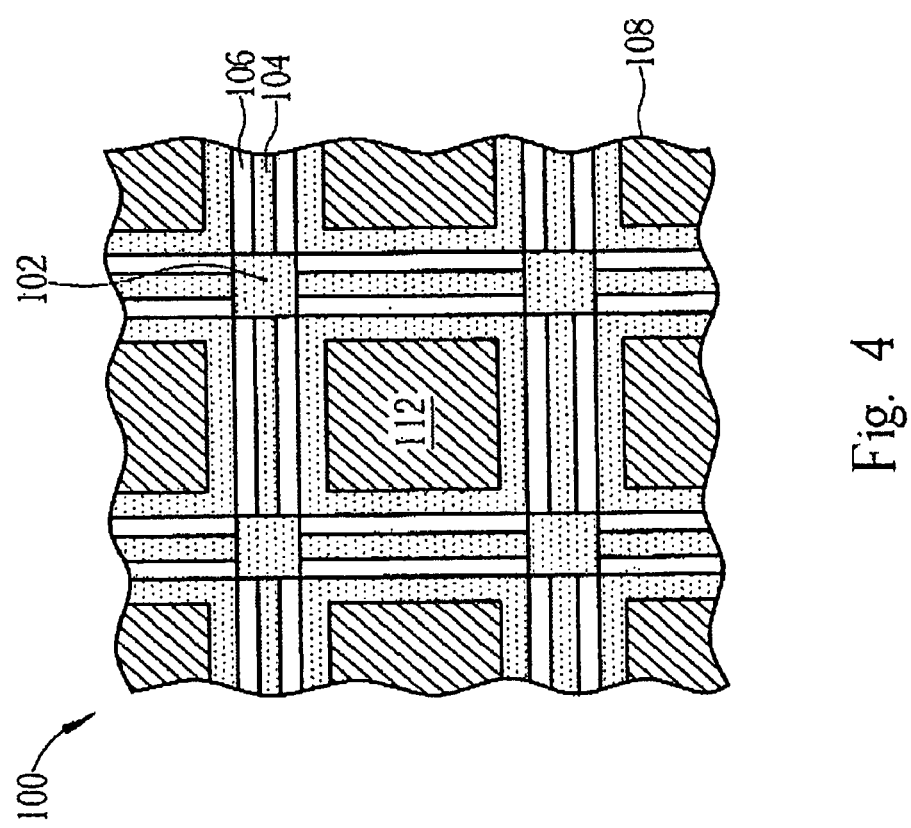
FIG. 4 is a top view of a selective chromeless alternate phase shift mask according to a first preferred embodiment of the present invention.
Figure 5:
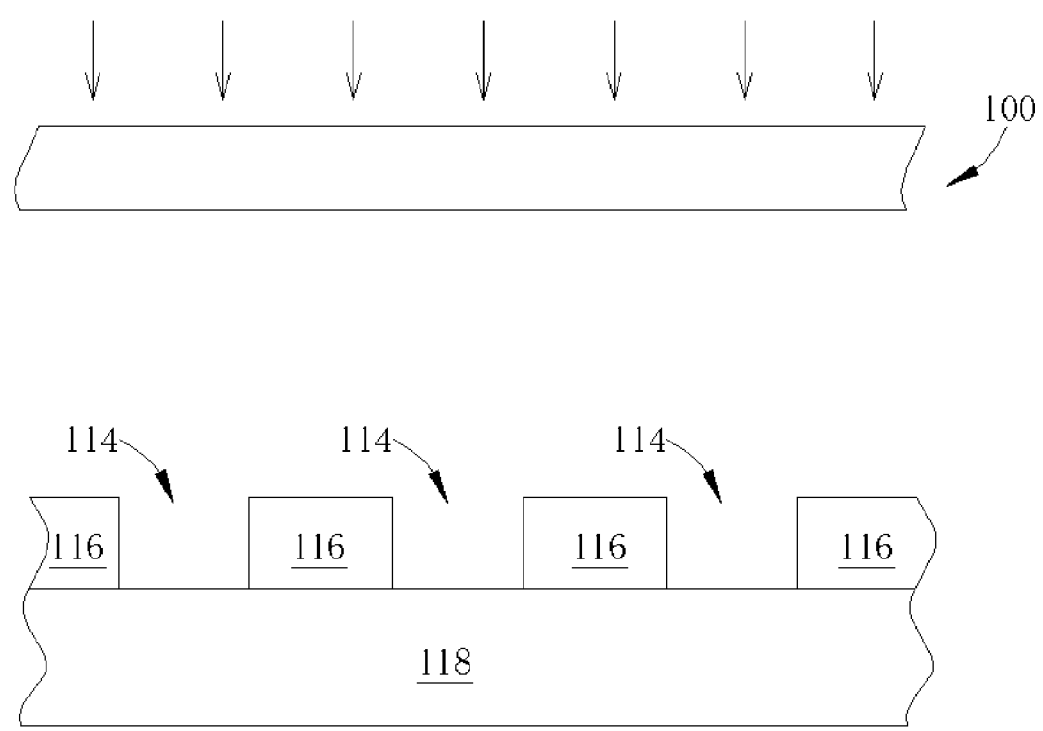
FIG. 5 is a schematic diagram illustrating a method for improving a resolution of contact hole patterns in a photoresist layer by utilizing the selective chromeless alternate phase shift mask according to the first preferred embodiment of the present invention.

Please refer to FIG. 4 and FIG. 5, FIG. 4 is a top view of a selective chromeless alternate phase shift mask 100 according to a first preferred embodiment of the instant invention. FIG. 5 is a schematic diagram illustrating a method for improving a resolution of contact hole patterns in a photoresist layer by utilizing the selective chromeless alternate phase shift mask 100 according to the first preferred embodiment of the instant invention. As shown in FIG. 4 and FIG. 5, the present invention method to improve the resolution of the contact hole patterns is to provide a selective chromeless alternate phase shift mask 100 first. The selective chromeless alternate phase shift mask 100 is a kind of phase shift mask. A plurality of transparent main features 102, a plurality of first phase shift transparent regions 104, and a plurality of second phase shift transparent regions 106 are included on the selective chromeless phase shift mask 100. Each of the transparent main features 102 is surrounded by the first phase shift transparent regions 104 and the second phase shift transparent regions 106 interlaced contiguously along a periphery of the transparent main feature 102, and each of the first phase shift transparent regions 104 has a phase shift of 180 degrees relative to each of the second phase shift transparent regions 106.

In the first preferred embodiment of the present invention, the first phase shift transparent region 104 has a phase shift of 180 degrees relative to the second phase shift transparent region 106, and the transparent main feature 102 has a phase shift of 0 degrees relative to the first phase shift transparent region 104. That means, when the phase of the first phase shift transparent region 104 is 0, the phase of the transparent main feature 102 is also 0, and the phase of the second phase shift transparent region 106 is $\pi$; when the phase of the first phase shift transparent region 104 is $\pi$, the phase of the transparent main feature 102 is $\pi$, and the phase of the second phase shift transparent region 106 is 0. In FIG. 4, the previous case is illustrated. Actually, the transparent main features 102, the first phase shift transparent regions 104, and the second phase shift transparent regions 106 are all formed on a same quartz substrate 108. By etching the quartz substrate 108 into two different thicknesses, the transparent main features 102 surrounded by the first phase shift transparent regions 104 and the second phase shift transparent regions 106, the first phase shift transparent regions 104, and the second phase shift transparent regions 106 are defined. Moreover, other portions of the quartz substrate 108 are plated with a chrome film (not shown) and used as first opaque regions 112.

The present invention method for improving the contrast by utilizing a selective chromeless alternate phase shift mask uses the same exposure process and development process as the prior art method, as shown in FIG. 5. However, when, light passes through the selective chromeless alternate phase shift mask 100 during the exposure process, a same optical path difference is resulted from the thickness difference between the first phase shift transparent regions 104 and the second phase shift transparent regions 106, and the thickness difference between the transparent main features 102 and the second phase shift transparent regions 106. Therefore, light passing through the first phase shift transparent regions 104 and the transparent main features 102 both have a phase shift of 180 degrees relative to light passing through the second phase shift transparent regions 106 to result in destructive interferences.

Although light passing through the transparent main features 102 and the second phase shift transparent regions 106 will produce the diffractive waveforms of the first order, the second order, etc., light passing through the transparent main features 102 always has a phase shift of 180 degrees relative to light passing through the second phase shift transparent regions 106. After the exposure, develop, and bake processes, a plurality of contact hole patterns 114 defined by a residual positive photoresist layer 116 and corresponding to the transparent main features 102 are formed in the positive photoresist layer 116 on a wafer 118. Because of the destructive interference of light occurring at the boundary of the transparent main features 102 and the contrast enhanced features, which are the second phase shift transparent regions 106 having a phase shift of 180 degrees relative to the transparent main features 102, the diffractive waveforms produced by light passing through the transparent main features 102 and the second phase shift transparent regions 106 cancel each other out. Consequently, the contrast of the aerial image is increased to improve the contrast and resolution of the contact hole patterns 114.

In addition, light passing through the first phase shift transparent regions 104 and the second phase shift transparent regions 106 will produce the diffractive waveforms of the first order, the second order, etc., too. However, light passing through the first phase shift transparent regions 104 will always have a phase shift of 180 degrees relative to light passing through the second phase shift transparent regions 106. Therefore, when an exposure process is performed to irradiate the selective chromeless phase shift mask 100 with light, light passing through the assistant features, which are the first phase shift transparent regions 104 having a phase shift of 0 degrees relative to the transparent main features 102, and the contrast enhanced features, which are the second phase shift transparent regions 106 having a phase shift of 180 degrees relative to the transparent main features 102, will result in destructive interference. As a result, the diffractive waveforms produced by light passing through the first phase shift transparent regions 104 and the second phase shift transparent regions 106 cancel each other out to eliminate the light leakage phenomenon occurring in the periphery of the contact hole patterns 114, which frequently occurs in the prior art.

Except for the main features 102, the first phase shift transparent regions 104, and the second phase shift transparent regions 106, other portions of the quartz substrate 108 may incur light leakage problem. In order to resolve this problem, these regions are plated with the chrome film (not shown) and are used as the first opaque regions 112 to prevent light from passing through and to avoid unwanted patterns to be formed in the photoresist layer 116. The opaque regions 112 are surrounded by the first phase shift transparent regions 104 and/or the second phase shift transparent regions 106 (in FIG. 4, the opaque regions 112 are surrounded by the first phase shift transparent regions 104), and are not connected with the transparent main features 102. Therefore, the opaque regions 112 will not affect the formation of the contact hole patterns 114.

It should be noted that the selective chromeless alternate phase shift mask 100 is used to improve the contrast of the contact hole patterns 114 in the first preferred embodiment of the present invention. Actually, the present invention method may be applied to any structure having high pattern density, such as trenches, memory cells in a memory array, and logic cells in a logic circuit. On the other hand, the present invention method may be applied to metal lines and island structures. Under the circumstances, the photoresist layer should be a negative photoresist layer. In addition, the present invention method is not only applied to a semiconductor wafer to produce semiconductor products, but is also applied to glass substrates, polymer substrates, or quartz substrates to produce other types of products.

Furthermore, the contact hole patterns 114 are not limited to arranging in an array. When the contact hole patterns 114 do not arrange in an array, the first phase shift transparent regions 104 and the second phase shift transparent regions 106 interlaced contiguously along a periphery of the transparent main features 102 are asymmetrical, leading to mismatch (not shown) at some locations between the transparent main features 102. At least one second opaque region (not shown) connected with the transparent main features 102 may be included on the selective chromeless phase shift mask 100 according to practical requirements. The second opaque region (not shown) connected with the main features 102 usually occupies a very small area to avoid the light leakage problem. Therefore, an area of the first opaque region 112 not connected with the main features 102 is larger than an area of the second opaque region (not shown) connected with the main features 102. In summary, any combinations such that the waveforms produced by the transparent main features 102, the first phase shift transparent regions 104, and the second phase shift transparent regions 106 cancel each other out when possible are included in the present invention.

Figure 6:
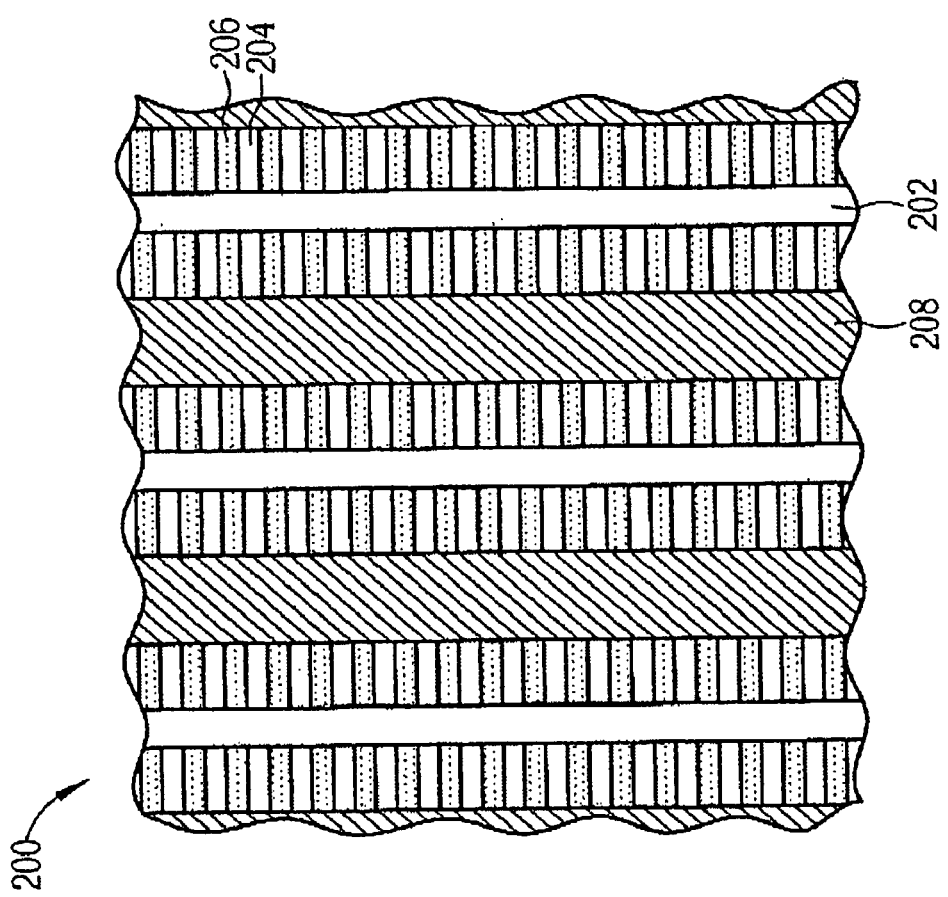
FIG. 6 is a top view of a selective chromeless alternate phase shift mask according to a second preferred embodiment of the present invention.

Please refer to FIG. 6, FIG. 6 is a top view of a selective chromeless alternate phase shift mask 200 according to a second preferred embodiment of the present invention. As shown in FIG. 6, the present invention selective chromeless alternate phase shift mask 200 comprises a plurality of transparent main features 202, a plurality of first phase shift transparent regions 204, a plurality of second phase shift transparent regions 206, and a plurality of opaque regions 208. Each of the transparent main features 202 is surrounded by the first phase shift transparent regions 204 and the second phase shift transparent regions 206 interlaced contiguously along a periphery of the transparent main feature 202. The opaque regions 208 are plated with a chrome film (not shown). In addition, each of the opaque regions 208 is surrounded by the first phase shift transparent regions 204 and/or the second phase shift transparent regions 206, and is not connected with the transparent main features 202.

According to the second preferred embodiment of the present invention, the first phase shift transparent region 204 has a phase shift of 180 degrees relative to the second phase shift transparent region 206, and the transparent main feature 202 has a phase shift of 0 degrees relative to the first phase shift transparent region 204. In FIG. 6, the phase of the first phase shift transparent region 204 is 0, the phase of the transparent main feature 202 is also 0, and the phase of the second phase shift transparent region 206 is $\pi$.

When light passes through the transparent main features 202 and the second phase shift transparent regions 206, the diffractive waveforms of the first order, the second order, etc., are produced. After the exposure, develop, and bake processes, a plurality of trench patterns (not shown) corresponding to the transparent main features 202 are formed in a positive photoresist layer (not shown) on a wafer (not shown). Due to the destructive interference of light occurring at the boundary of the transparent main features 202 and the contrast enhanced features, which are the second phase shift transparent regions 206, the diffractive waveforms produced by light passing through the transparent main features 202 and the second phase shift transparent regions 206 cancel each other out. Therefore, the contrast of the aerial image is increased to improve the contrast and resolution of the trench patterns (not shown).

In addition, light passing through the first phase shift transparent regions 204 and the second phase shift transparent regions 206 will produce the diffractive waveforms of the first order, the second order, etc. However, light passing through the first phase shift transparent regions 204 will always have a phase shift of 180 degrees relative to light passing through the second phase shift transparent regions 206. Therefore, when an exposure process is performed to irradiate the selective chromeless phase shift mask 200 with light, light passing through the assistant features, which are the first phase shift transparent regions 204, and the contrast enhanced features, which are the second phase shift transparent regions 206, will result in destructive interference. As a result, the diffractive waveforms produced by light passing through the first phase shift transparent regions 204 and the second phase shift transparent regions 206 cancel each other out to eliminate the light leakage phenomenon occurring in the periphery of the trench patterns (not shown), which frequently occurs in the prior art. Furthermore, since the practice methods in this preferred embodiment are the same as the first preferred embodiment, they are not mentioned redundantly.

The present invention lithography method, used for improving the resolution and the light leakage problem of the dense patterns, utilizes a selective chromeless alternate phase shift mask. The waveforms produced by light passing through the transparent main features and the contrast enhanced features cancel each other out to increase the contrast of the aerial image and to improve the contrast and resolution of the dense patterns. In addition, the waveforms produced by light passing through the assistant features and the contrast enhanced features cancel each other out to eliminate the light leakage problem occurring in the periphery of the dense patterns frequently occurring in the prior art. When the present invention method is applied to a practical production line, yield is improved, manpower is saved, equipment lifetime is elongated, cycle time is shortened, and the cost is reduced.

In contrast to the prior art method for improving the resolution of the contact hole patterns, the present invention method utilizes a selective chromeless alternate phase shift mask to form the contact hole patterns and other dense patterns having a superior contrast and resolution in the photoresist layer. The waveforms produced by light passing through the transparent main features and the contrast enhanced features cancel each other out to increase the contrast of the aerial image and to improve the contrast and resolution of the contact hole patterns and other dense patterns. Moreover, the waveforms produced by light passing through the assistant features and the contrast enhanced features cancel each other out to eliminate the light leakage problem occurring in the periphery of the dense patterns frequently occurring in the prior art. Furthermore, the conventional exposure, develop, and bake processes are utilized without changing processes. Because the present invention method is able to form the contact hole patterns and other dense patterns which have a superior resolution and contrast with facility, a light source generating short wavelength of light does not need to be used when performing the exposure process. As a result, yield is improved, manpower is saved, equipment lifetime is elongated, cycle time is shortened, and the cost is reduced.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A lithography method for forming a plurality of patterns in a photoresist layer on a substrate, the method comprising the following steps:
    providing a phase shift mask (PSM) comprising a plurality of transparent main features, a plurality of first phase shift transparent regions, and a plurality of second phase shift transparent regions, each of the transparent main features being surrounded by the first phase shift transparent regions and the second phase shift transparent regions in a way that the first phase shift transparent regions and the second phase shift transparent regions are interlaced contiguously along a periphery of one of the transparent main features and the first phase shift transparent regions and the second phase shift transparent regions along the periphery have a boundary with each other and a boundary with the transparent main feature, and each of the first phase shift transparent regions having a phase shift relative to each of the second phase shift transparent regions; and
    performing an exposure process to irradiate the photoresist layer through the phase shift mask with light so that the patterns corresponding to the transparent main features are formed in the photoresist layer.

2. The method of claim 1 wherein the substrate comprises a semiconductor wafer, a glass substrate, a polymer substrate, or a quartz substrate.

3. The method of claim 1 wherein the photoresist layer is a positive photoresist layer.

4. The method of claim 3 wherein the pattern comprises a contact hole pattern, a trench pattern, a memory cell pattern of a memory array, or a logic cell pattern of a logic circuit.

5. The method of claim 1 wherein the photoresist layer is a negative photoresist layer.

6. The method of claim 5 wherein the pattern comprises a metal line pattern or an island pattern.

7. The method of claim 1 wherein the phase shift mask is a selective chromeless phase shift mask.

8. The method of claim 7 wherein the first phase shift transparent region has a phase shift of 180 degrees relative to the second phase shift transparent region, and the transparent main feature has a phase shift of 0 degrees relative to the first phase shift transparent region.

9. The method of claim 7 wherein the first phase shift transparent region has a phase shift of 180 degrees relative to the second phase shift transparent region, and the transparent main feature has a phase shift of 0 degrees relative to the second phase shift transparent region.

10. The method of claim 7 wherein the phase shift mask comprises at least one opaque region not connected with the main features.

11. The method of claim 10 wherein the phase shift mask comprises at least one opaque region connected with the main features.

12. The method of claim 11 wherein an area of the opaque region not connected with the main features is larger than an area of the opaque region connected with the main features.

13. A lithography method for forming a plurality of patterns in a photoresist layer on a substrate, the method comprising the following steps:

providing a phase shift mask (PSM) comprising a plurality of transparent main features, a plurality of first phase shift transparent regions, a plurality of second phase shift transparent regions having a phase shift relative to the first phase shift transparent regions, and at least one first opaque region, each of the transparent main features being surrounded by the first phase shift transparent regions and the second phase shift transparent regions in a way that the first phase shift transparent regions and the second phase shift transparent regions are interlaced contiguously along a periphery of one of the transparent main features and the first phase shift transparent regions and the second phase shift transparent regions along the periphery have a boundary with each other and a boundary with the transparent main feature, and the first opaque region being not connected with the main features; and performing an exposure process to irradiate the photoresist layer through the phase shift mask with light so that the patterns corresponding to the transparent main features are formed in the photoresist layer.

14. The method of claim 13 wherein the substrate comprises a semiconductor wafer, a glass substrate, a polymer substrate, or a quartz substrate.

15. The method of claim 13 wherein the pattern comprises a contact hole pattern, a trench pattern, a memory cell pattern of a memory array, a logic cell pattern of a logic circuit, a metal line pattern or an island pattern.

16. The method of claim 13 wherein the phase shift mask is a selective chromeless phase shift mask.

17. The method of claim 16 wherein the first phase shift transparent region has a phase shift of 180 degrees relative to the second phase shift transparent region, and the main feature has a phase shift of 0 degrees relative to the first phase shift transparent region.

18. The method of claim 16 wherein the first phase shift transparent region has a phase shift of 180 degrees relative to the second phase shift transparent region, and the main feature has a phase shift of 0 degrees relative to the second phase shift transparent region.

19. The method of claim 13 wherein the phase shift mask comprises at least one second opaque region connected with the main features.

20. The method of claim 19 wherein an area of the first opaque region is larger than an area of the second opaque region.

* * * * *